United States Patent [19]
Goronkin et al.

[11] Patent Number: 5,629,215
[45] Date of Patent: May 13, 1997

[54] METHOD OF FABRICATING AND CONTACTING ULTRA-SMALL THREE TERMINAL SEMICONDUCTOR DEVICES

[75] Inventors: Herbert Goronkin, Tempe, Ariz.; Martin Walther, Crailsheim, Germany; Raymond K. Tsui, Phoenix, Ariz.

[73] Assignee: Motorola, Schaumburg, Ill.

[21] Appl. No.: 609,706

[22] Filed: Mar. 1, 1996

[51] Int. Cl.⁶ .................................. H01L 49/00
[52] U.S. Cl. ................... 438/492; 438/494; 438/979
[58] Field of Search ....................... 437/6, 51, 175, 437/176, 177, 184, 906

[56] References Cited

U.S. PATENT DOCUMENTS

| | | | |
|---|---|---|---|
| 4,914,045 | 4/1990 | Webb et al. | 437/6 |
| 5,155,050 | 10/1992 | Bayraktaroglu | 437/906 |
| 5,445,985 | 8/1995 | Calviello et al. | 437/184 |
| 5,496,755 | 3/1996 | Bayraktaroglu | 437/51 |

*Primary Examiner*—Chandra Chaudhari
*Attorney, Agent, or Firm*—Eugene A. Parsons

[57] ABSTRACT

Ultra-small three terminal semiconductor devices and a method of fabrication including patterning the planar surface of a substrate and a control layer to form a first and second pattern edge and consecutively forming a plurality of layers of semiconductor material in overlying relationship to the pattern edges so that a discontinuity is produced in the layers and a first layer on one side of the pattern edge is aligned with and in electrical contact with a different layer on the other side of the pattern edge.

8 Claims, 3 Drawing Sheets

METHOD OF FABRICATING AND CONTACTING ULTRA-SMALL THREE TERMINAL SEMICONDUCTOR DEVICES

FIELD OF THE INVENTION

The present invention pertains to ultra-small semiconductor devices and more specifically to improved techniques for fabricating ultra-small semiconductor devices.

BACKGROUND OF THE INVENTION

Generally, in the semiconductor industry the most difficulties and/or problems occur with the formation of external electrical connections and with interconnections to different components on a single substrate. Semiconductor devices are typically fabricated on a planar substrate by sequentially growing or depositing several different layers of material and then patterning or etching one or more of the layers to expose a lower surface. Metal is then deposited on the exposed surfaces for interconnections or external connections.

One problem in this process is that the etching requires masking which adds several complicated steps to the process and, consequently, a large amount of labor and cost. Also, the metal contacts require a relatively large amount of real estate and, consequently, many semiconductor devices are limited in size by the ability to provide external connections to them.

The difficulties and or problems are particularly acute when a three terminal semiconductor device is desired. The architecture of these devices is much more complicated, requiring additional masking and etching steps and a great deal more real estate is required to accommodate the extra terminal.

Accordingly, it would be highly advantageous to provide ultra-small three terminal semiconductor devices and methods of manufacture and connection.

It is another purpose of the present invention to provide novel ultra-small three terminal semiconductor devices and methods of fabrication and connection in which at least some of the interconnections are formed automatically during the formation of the various layers.

It is a further purpose of the present invention to provide novel ultra-small three terminal semiconductor devices which are smaller than previously possible with standard external terminals.

It is still a further purpose of the present invention to provide novel ultra-small three terminal semiconductor devices using simplified methods of fabrication and connection.

SUMMARY OF THE INVENTION

Briefly, to achieve the desired objects of the instant invention in accordance with a preferred embodiment thereof, provided is an ultra-small semiconductor device and a method of fabrication. The method includes providing a supporting substrate having a planar surface, forming a control layer on the planar surface of the supporting substrate, the control layer having a planar surface opposite the supporting substrate, patterning the planar surface of the control layer at least down to the planar surface of the substrate to form a first pattern edge with a side wall, conformably forming a layer of material over the planar surface of the control layer and the planar surface of the supporting substrate including the side wall of the first pattern edge, anisotropically removing the layer of material so as to leave a selected thickness of the layer of material covering the side wall, etching the planar surface of the supporting substrate to form a second pattern edge laterally spaced the selected thickness from the first pattern edge by using the selected thickness of the layer of material covering the side wall as a mask, removing the selected thickness of the layer of material covering the side wall, and consecutively forming a plurality of overlying layers of material, at least partially defining a semiconductor device, in overlying relationship to first and second opposite sides of each of the first and second pattern edges so that discontinuities are produced in the layers at each of the first and second pattern edges and a first layer of the plurality of layers on the first opposite side of the first pattern edge is aligned with and in electrical contact with a second layer of the plurality of layers on the second opposite side of the first pattern edge, a third layer of the plurality of layers on the second opposite side of the first pattern edge is aligned with and in electrical contact with the control layer, and a fourth layer of the plurality of layers on the first opposite side of the second pattern edge is aligned with and in electrical contact with a fifth layer of the plurality of layers on the second opposite side of the second pattern edge.

Thus, electrical interconnections between different layers of the device are automatically formed during fabrication. Current carrying electrodes are formed on opposite sides of the discontinuities and a control electrode is formed on the control layer to complete the device.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENTS

Figure 1:
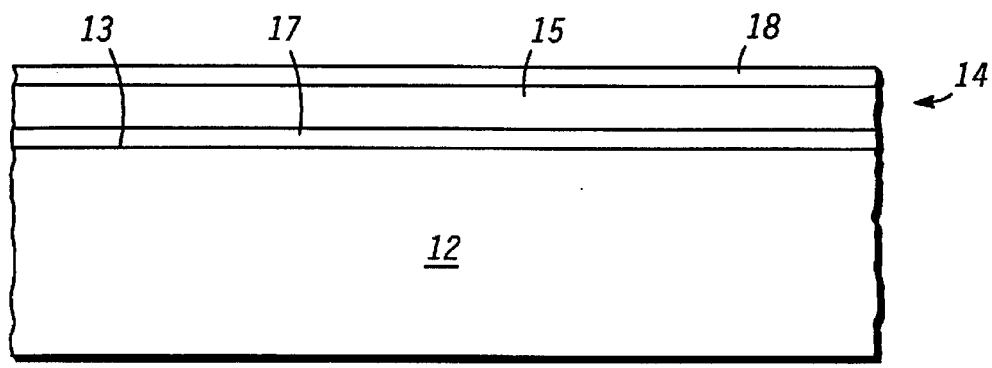
FIGS. 1–8 are simplified sectional views of the steps in the formation of an ultra small three terminal semiconductor device in accordance with the present invention.

Turning now to the drawings in which like reference characters indicate corresponding elements throughout the several views, attention is directed to FIGS. 1–8 which illustrate steps in the fabrication of a novel ultra-small three terminal semiconductor device which is smaller than previously possible with standard external terminals.

Referring specifically to FIG. 1, a supporting substrate 12 is illustrated having a generally planar surface 13 upon which is formed a control layer generally designated 14. Control layer 14 includes a layer 15 of semiconductor material having a conductivity type opposite to that of the resonant tunneling diodes (RTD) which will be subsequently formed and will be described later in the description. Preferably, layer 15 is formed of a semiconductor material such as GaAs or GaSb doped with an impurity to form a p-type conductivity, epitaxially grown on planar surface 13 of substrate 12. It should be understood however, that layer 15 may be implanted into substrate 12, in which case, for purposes of this disclosure, the planar surface of the substrate would be directly under the implanted region.

To reduce leakage current, which will be made clear in the continuing description, control layer 14 also includes layers 17 and 18 sandwiching layer 15 therebetween. Layers 17 and 18 are formed of material having a large bandgap. The material employed is dependent upon the material used for the RTDs. For example, the large bandgap material may be GaAsP for a GaAs/AlGaAs RTD, InAlAs for a InGaAs/InAlAs RTD, AlSb for a InAs/AlSb/GaSb RTD, etc.

Figure 2:
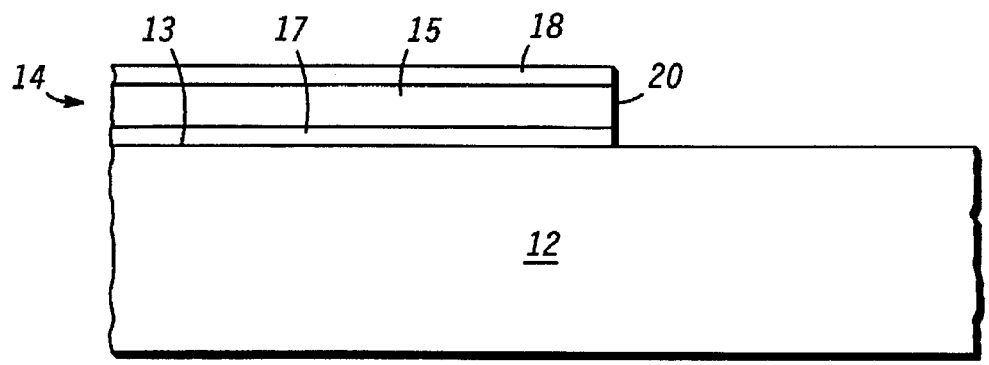
Figure 3:
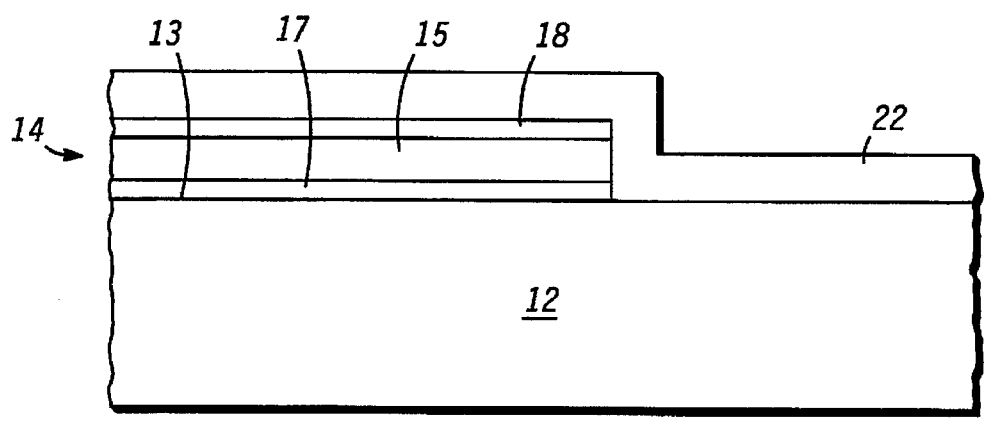
Figure 4:
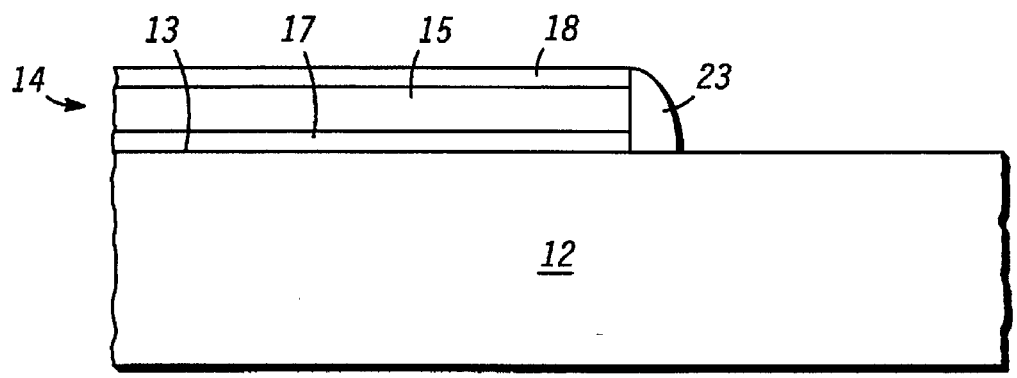

A first pattern edge 20 is formed through control layer 14 to at least planar surface 13 of substrate 12 by any convenient patterning technique, as illustrated in FIG. 2. First pattern edge 20 is formed as a ridge, often referred to as a mesa structure. It will be understood that pattern edge 20 may extend into substrate 12 if necessary to adjust the height of first pattern edge 20. A dielectric layer 22 is then conformably deposited over the entire surface of substrate 12 and control layer 14, including the side wall of pattern edge 20, as illustrated in FIG. 3. Dielectric layer 22 can be any convenient material, such as Si3N4, SiO2, etc. Dielectric layer 22 is then anisotropically etched to form a side wall spacer 23 as seen in FIG. 4. Generally, as will be understood by those skilled in the art, the thickness of spacer 23, at the bottom thereof (which is the desired dimension), is controlled by the initial thickness of dielectric layer 22.

Figure 5:
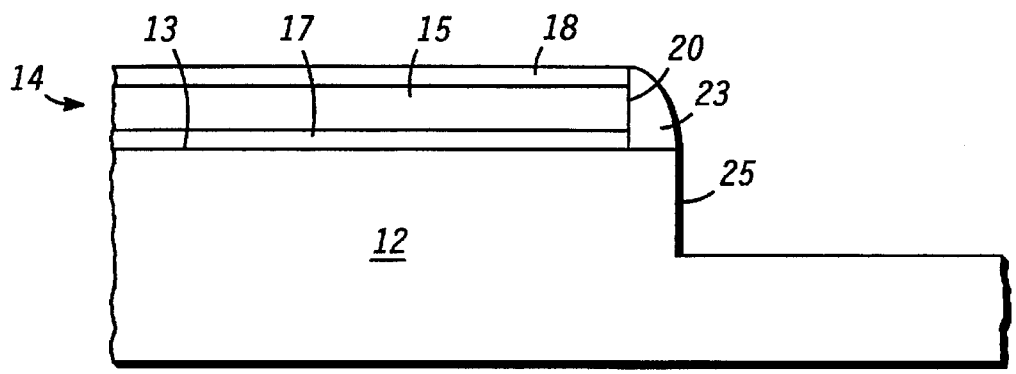

With spacer 23 formed to the desired thickness on the side wall of first pattern edge 20, an etch of substrate 12 is performed using spacer 23 as a mask. As illustrated in FIG. 5, the etch results in a second pattern edge 25 spaced laterally (and vertically) from first pattern edge 20. This etch process can also affect layers 18, 15, and 17, if nonselective etching is applied. One method that may be utilized to protect layers 18, 15, and 17 is to provide a sacrificial layer (not shown) on the surface of layer 18. A second method of protection is to provide a thin etch stop layer (not shown) on the surface of layer 18 This etch stop layer (for example AlAs for selective dry etching of GaAs) can be removed after the formation of the second pattern edge 25.

Figure 6:
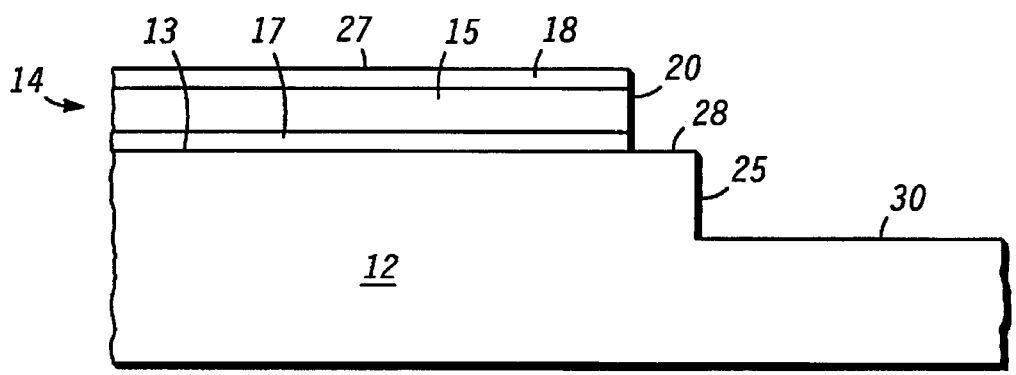

After the etch of substrate 12 to form second pattern edge 25, spacer 23 is removed as shown in FIG. 6. Thus, an upper surface 27 is defined to one side of pattern edge 20, a step surface 28 is defined between pattern edges 20 and 25 and a lower surface 30 is defined to the opposite side of pattern edge 25. It is important to note two things at this time: first, all of the patterning and etching is performed on substrate 12 and control layer 14 prior to forming any other of the layers of the three terminal semiconductor device so no damage can occur to these layers; and second, the size of step surface 28 is controlled by the thickness of dielectric layer 22 and much smaller geometries can be achieved than can be realized by using standard lithography.

Figure 7:
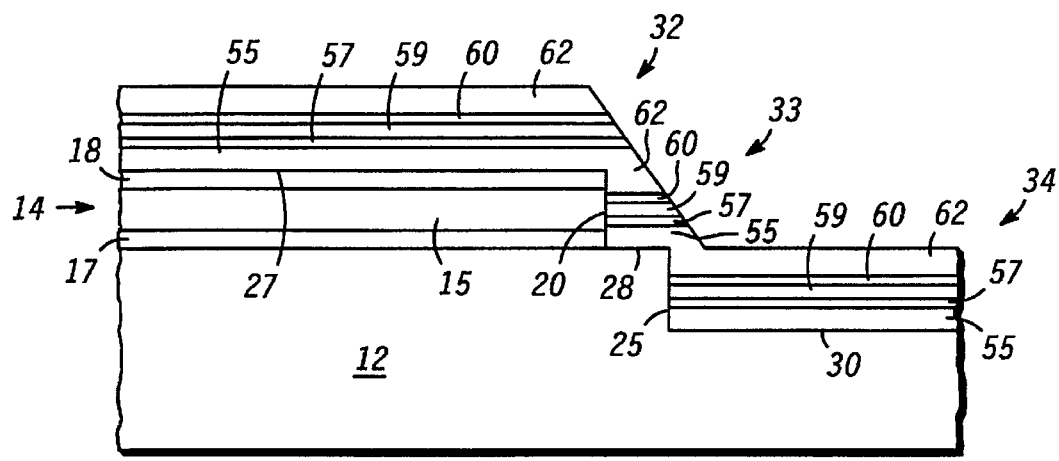

Referring now to FIG. 7, patterned substrate 12 and control layer 14 (of FIG. 6) are illustrated with stacked double barrier diodes 32 and 33 formed thereon. A diode 34 is also formed on top of surface 30, but is not utilized in this specific embodiment. For purposes of example a three terminal device using stacked double barrier resonant interband tunneling diode is described, but it will be understood that other devices such as field effect transistor structures, etc. may be employed. Once substrate 12 and control layer 14 are completely patterned, a plurality of epitaxial layers are sequentially grown on surfaces 27, 28, and 30. The plurality of layers of semiconductor material are sequentially formed on the upper surfaces of substrate 12 and control layer 14 so as to overlie both sides of both pattern edges 20 and 25. In this specific embodiment, the plurality of layers are epitaxially grown to form a first access layer 55 having n+-type conductivity grown on surfaces 27, 28, and 30, a first barrier layer 57 on layer 55, an active quantum well layer 59 on first barrier layer 57, a second barrier layer 60 on active quantum well layer 59 and a second access layer 62 having n+-type conductivity grown on second barrier layer 60. As will be understood, layers 55, 57, 59, 60, and 62 are epitaxially grown by any convenient technique, including but not limited to MBE, MOCVD, CBE, etc.

The growth rate of a crystallographic plane is determined by the sticking coefficient of the adatoms and their migration length. Sticking coefficients and adatom migration lengths depend strongly on adatom species, crystallographic planes and growth parameters, and can vary over a wide range. The morphology of overgrown structures is therefore strongly affected by the faceted growth behavior at the pattern edges. The initial shape of the structure is changed during growth and distinguished crystallographic planes are formed at the pattern edges. The thickness of these individual layers depends on the crystallographic plane, the adatom species and the growth parameters. Gallium, for example, has a very low sticking coefficient on (111)B facets and a high migration length on these planes. Therefore, Ga is not likely to nucleate on these planes. Aluminum, in contrast, has a high sticking coefficient and a low migration length on these facets. As a result, different growth rates and different layer thickness are obtained on (111)B facets for these materials. Dependent on the growth conditions and the specific material, facets with very low growth rates can be obtained. These planes are usually called non-growth planes.

Pattern edges 20 and 25 are selected to be no-growth facets so that a discontinuity is produced in layers 55–62 at pattern edges 20 and 25. Generally, the facet formation next to pattern edges 20 and 25 during epitaxial growth on substrate 12 and control layer 14 is determined by the crystallographic orientation, the adatom species and the growth parameters. Using the faceted growth behavior at pattern edges 20 and 25, first access layer 55 grown on one side of pattern edge 20 (on surface 27) is aligned with and in electrical contact with second access layer 62 grown on the other side of pattern edge 20 (on surface 28) and first access layer 55 grown on one side of pattern edge 25 (on surface 28) is aligned with and in electrical contact with second access layer 62 grown on the other side of pattern edge 25 (on surface 30). Since first pattern edge 20 is actually formed through control layer 14, the side wall of pattern edge 20 includes layer 15. Active layer 59 on one side of pattern edge 20 (on surface 28) is aligned with and in electrical contact with layer 15.

A crucial point in the fabrication of the three terminal semiconductor device is to avoid shorts between first access layer 55 grown on one side of pattern edge 20 (on surface 27) and first access layer 55 grown on the other side of pattern edge 20 (on surface 28). A complete discontinuity is achieved between these layers by choosing an appropriate etch depth (the height of pattern edges 20 and 25), pattern orientation and thickness of epitaxial layers 55–62. Generally, it is desired to make pattern edge 20 as sharp as possible and the height of the ridge greater than the total thickness of layers 55–60 but less than a total thickness of layers 55–62.

Figure 8:
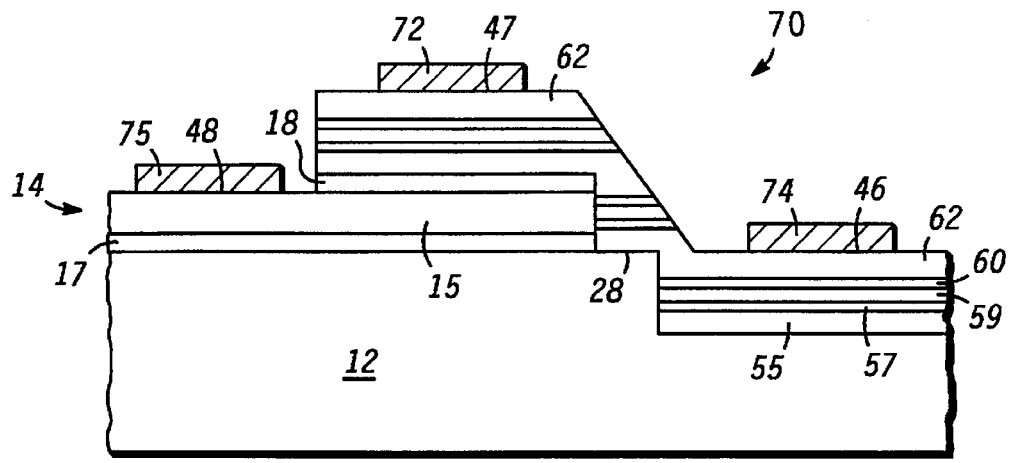

Turning now to FIG. 8, a three terminal device generally designated 70 is completed by forming external contacts or terminals thereto. This is accomplished by removing a portion of layers 55–62 located on one side of first pattern edge 20 on surface 27. The portion removed is spaced from first pattern edge 20. When large bandgap layers 17 and 18 are used, as in the present embodiment, a portion of layer 18 is also removed. This provides access to layer 15. Simply by evaporating ohmic metal contacts by the lift-off technique onto the surface of layer 62 in overlying relationship to surfaces 46, 47 and 48 and onto the exposed surface of layer 15 of control layer 14, three terminal device 70 is provided. In this fashion, a first current carrying electrode 72 is formed on layer 62 on a first side of pattern edge 20, which operates as a source or emitter for diode 33. A second current carrying electrode 74 is formed on layer 62 on the opposite side of pattern edge 25 and operates as a drain or collector for diode 33. A control electrode 75 is formed on layer 15 of control layer 14 exposed as described previously, and operates as a gate or base. In this embodiment, layers 55, 57, 59 and 60, on the side of pattern edge 25 opposite step surface 28 are not connected and simply fill the groove adjacent pattern edge 25.

The area of diode 32 is much larger than the area of diode 33 with the result that diode 32 is essentially an ohmic contact for diode 33. In this application diode 33 can be made so small that external electrical contact cannot be made by conventional methods. However, in the disclosed embodiment diode 33 can be made as small as desired and external connections are made through larger diode 32 at electrode 72, electrode 74 and control layer 14 at electrode 75. Further, because of the novel technique for constructing step surface 28, diode 33 can be made much smaller than was previously possible using standard lithographic techniques.

Figure 9:
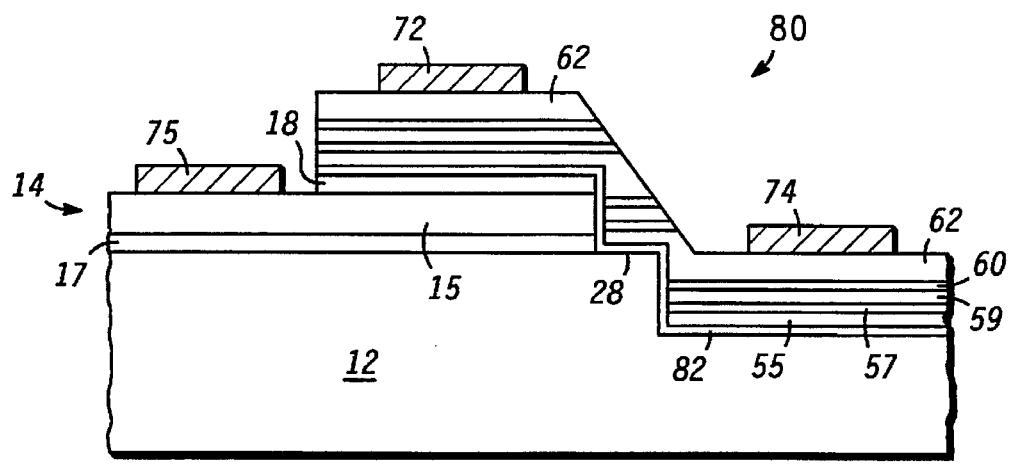
FIG. 9 is a simplified sectional view of another embodiment of an ultra small three terminal semiconductor device in accordance with the present invention.

Turning now to FIG. 9, another embodiment of an ultra small three terminal semiconductor device generally designated 80 is illustrated. The n+- P++ region under first current carrying electrode 72 (source) of device 70 is high in capacitance. To minimize the capacitance, device 80 employs an insulator layer between the control layer and the subsequently deposited layers. Device 80 is substantially identical to and is formed in substantially the same manner as device 70 described previously with the addition of an insulator layer 82 deposited on control layer 14 and the surface of substrate 12 after patterning both first and second pattern edges 20 and 25 and prior to removing spacer 23. Insulator layer 82 may be formed from a variety of dielectric materials such as Si3N4, SiO2, etc. Epitaxial growth of layers 55–62 will now occur on the small step (surface 28) as described previously, while the material deposited on surfaces 27 and 30 will be polycrystalline. Since these are the contact or terminal regions, the device series resistance will not be degraded.

Accordingly, novel three terminal semiconductor devices and methods of manufacture are disclosed which eliminate many patterning and/or etching steps in the formation of the three terminal semiconductor devices and interconnections and external connections therefor. Further, the patterning and etching steps which are used in the present novel devices and methods are performed prior to the formation of any active layers in the devices so that there is no danger of damage and/or contamination. Further, novel ultra-small three terminal semiconductor devices and methods of fabrication and connection are disclosed in which at least some of the interconnections are formed automatically during the formation of the various layers. Also, novel ultra-small three terminal semiconductor devices which are smaller than previously possible with standard external terminals are disclosed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating three terminal semiconductor devices comprising the steps of:

providing a supporting substrate having a planar surface;

forming a control layer on the planar surface of the supporting substrate, the control layer having a planar surface opposite the supporting substrate;

patterning the planar surface of the control layer at least down to the planar surface of the substrate to form a first pattern edge with a side wall;

conformably forming a layer of material over the planar surface of the control layer and the planar surface of the supporting substrate, including the side wall of the first pattern edge;

anisotropically removing the layer of material so as to leave a selected thickness of the layer of material covering the side wall;

etching the planar surface of the supporting substrate to form a second pattern edge laterally spaced the selected thickness from the first pattern edge by using the selected thickness of the layer of material covering the side wall as a mask;

removing the selected thickness of the layer of material covering the side wall; and consecutively forming a plurality of overlying layers of material, at least partially defining a semiconductor device, in overlying relationship to first and second opposite sides of each of the first and second pattern edges so that discontinuities are produced in the layers at each of the first and second pattern edges and a first layer of the plurality of layers on the first opposite side of the first pattern edge is aligned with and in electrical contact with a second layer of the plurality of layers on the second opposite side of the first pattern edge, a third layer of the plurality of layers on the second opposite side of the first pattern edge is aligned with and in electrical contact with the control layer, and a fourth layer of the plurality of layers on the first opposite side of the second pattern edge is aligned with and in electrical contact with a fifth layer of the plurality of layers on the second opposite side of the second pattern edge.

2. A method of fabricating three terminal semiconductor devices as claimed in claim 1 wherein the patterning step includes patterning a ridge with a selected height on the planar surface of the control layer and the first pattern edge is defined by an edge of the ridge, and the second pattern edge defines a step surface between the second pattern edge and the first pattern edge surrounding the ridge and the surface of the substrate defines a third surface surrounding the step surface.

3. A method of fabricating three terminal semiconductor devices as claimed in claim 2 wherein the step of consecutively forming includes selecting the plurality of overlying layers of material so as to form a first semiconductor device on the ridge and a second semiconductor device on the step surface connected in series to the first semiconductor device.

4. A method of fabricating three terminal semiconductor devices as claimed in claim 3 and further including the step of removing a portion of the first semiconductor device from the control layer, the portion being spaced from the first pattern edge, forming first and second current carrying electrodes on an upper surface of the plurality of layers of material on the ridge and on the plurality of layers of material on the third surface respectively, and forming a control electrode on the control layer.

5. A method of fabricating three terminal semiconductor devices as claimed in claim 1 wherein the step of forming the control layer includes implanting the control layer.

6. A method of fabricating three terminal semiconductor devices as claimed in claim 1 wherein the step of forming a control layer includes epitaxially depositing the control layer.

7. A method of fabricating three terminal semiconductor devices as claimed in claim 6 wherein the step of depositing the control layer further includes depositing a layer of semiconductor material having a first conductivity type sandwiched between two layers formed of material having a large bandgap.

8. A method of fabricating three terminal semiconductor devices as claimed in claim 7 further including the step of forming an insulator layer on the control layer and the surface of the substrate after etching the planar surface of the supporting substrate and prior to removing the selected thickness of the layer of material covering the side wall.

* * * * *